US008698691B2

(12) United States Patent
Chen et al.

(10) Patent No.: US 8,698,691 B2
(45) Date of Patent: Apr. 15, 2014

(54) INTERNAL COOLING SYSTEM FOR A RADOME

(75) Inventors: Kevin W. Chen, McKinney, TX (US); Brandon H. Allen, Wylie, TX (US); Kerrin A. Rummel, Richardson, TX (US); Gary L. Seiferman, Plano, TX (US); Richard M. Weber, Prosper, TX (US); William P. Harokopus, McKinney, TX (US)

(73) Assignee: Ratheon Company, Waltham, MA (US)

( * ) Notice: Subject to any disclaimer, the term of this patent is extended or adjusted under 35 U.S.C. 154(b) by 864 days.

(21) Appl. No.: 12/511,667

(22) Filed: Jul. 29, 2009

(65) Prior Publication Data

US 2010/0206523 A1 Aug. 19, 2010

Related U.S. Application Data

(60) Provisional application No. 61/137,524, filed on Jul. 30, 2008.

(51) Int. Cl.
*H01Q 1/42* (2006.01)
*H05K 7/20* (2006.01)
*F28D 15/00* (2006.01)

(52) U.S. Cl.
USPC .................. 343/872; 343/911 R; 165/104.33; 361/689; 361/699

(58) Field of Classification Search
USPC ..................... 343/872, 873, 704, 709, 911 R; 361/688, 699, 700; 165/104.33
See application file for complete search history.

(56) References Cited

U.S. PATENT DOCUMENTS

| | | | | | |
|---|---|---|---|---|---|
| 2,755,216 | A * | 7/1956 | Lemons | 156/155 |
| 3,080,816 | A * | 3/1963 | Levine | 250/238 |
| 3,081,051 | A * | 3/1963 | Robinson, Jr. | 244/3.15 |
| 3,805,017 | A | 4/1974 | Roberts et al. | |
| 3,871,001 | A * | 3/1975 | Myers | 343/872 |
| 3,925,783 | A | 12/1975 | Bleday et al. | |
| 4,155,970 | A * | 5/1979 | Cassell | 264/137 |
| 4,463,409 | A * | 7/1984 | Altoz et al. | 361/689 |
| 4,691,616 | A * | 9/1987 | Larsson et al. | 89/41.07 |
| 5,182,155 | A * | 1/1993 | Roe | 428/116 |
| 5,684,493 | A * | 11/1997 | Floyd et al. | 343/709 |
| 6,107,976 | A * | 8/2000 | Purinton | 343/872 |
| 2003/0021076 | A1* | 1/2003 | Sillence et al. | 361/218 |
| 2007/0107647 | A1 | 5/2007 | Nelson | |
| 2008/0001841 | A1 | 1/2008 | Alberding et al. | |

FOREIGN PATENT DOCUMENTS

| | | | |
|---|---|---|---|
| FR | 2 631 745 | A1 | 11/1989 |
| GB | 870 917 | A | 6/1961 |

OTHER PUBLICATIONS

Plimpton "High Power Radome Panel Design Consideration", APS-6-10, 1984 IEEE, pp. 209-211, 1984.
PCT Notification of Transmittal of the International Search Report and the Written Opinion of the International Searching Authority, or the Declaration; International Application No. PCT/US2009/052191; dated Nov. 10, 2009; 15 pages.

* cited by examiner

*Primary Examiner* — Robert Karacsony
*Assistant Examiner* — Amal Patel
(74) *Attorney, Agent, or Firm* — Cantor Colburn LLP

(57) ABSTRACT

According to one embodiment, a radome includes two dielectric layers separated by an internal layer. The internal layer is configured with an internal cooling system including a fluid channel that receives a fluid through an inlet port, conducts heat from the radome to the fluid, and exhausts the heated fluid through an outlet port.

21 Claims, 5 Drawing Sheets

INTERNAL COOLING SYSTEM FOR A RADOME

RELATED APPLICATIONS

This application claims priority to U.S. Provisional Patent Application Ser. No. 61/137,524, entitled "HEAT REMOVAL SYSTEM FOR A RADOME," which was filed on Jul. 30, 2008. U.S. Provisional Patent Application Ser. No. 61/137,524 is hereby incorporated by reference.

TECHNICAL FIELD OF THE DISCLOSURE

This disclosure relates generally to radomes, and more particularly to an internal cooling system for a radome.

BACKGROUND OF THE DISCLOSURE

Antennas, such as those that operate at microwave frequencies, typically include multiple radiating elements having relatively precise structural characteristics. To protect these elements, a covering referred to as a radome may be configured between the elements and the ambient environment. The radome may shield the radiating elements of the antenna from various environmental aspects, such as precipitation, humidity, solar radiation, or other forms of debris that may compromise the performance of the antenna. The radome may possess structural rigidity as well as relatively good electrical properties for transmitting electro-magnetic radiation through its structure.

SUMMARY OF THE DISCLOSURE

According to one embodiment, a radome includes two dielectric layers separated by an internal layer. The internal layer is configured with an internal cooling system including a fluid channel that receives a fluid through an inlet port, conducts heat from the radome to the fluid, and exhausts the heated fluid through an outlet port.

Certain embodiments of the disclosure may provide certain technical advantages. In some embodiments, the amount of heat that may be removed from a radome may be increased. For example, known combinations of passive and modified-passive heat removal systems may remove heat up to approximately 30 Watts/inch$^2$ under certain conditions. Including the internal cooling system of the present disclosure with the passive and modified-passive heat removal systems of certain embodiments may increase heat removal to at least approximately 50 Watts/inch$^2$ under similar conditions. In addition to increasing the amount heat dissipated, the internal cooling system may dissipate heat from the relatively hot layers of the radome nearest the heat source, the antenna.

Although specific advantages have been enumerated above, various embodiments may include all, some, or none of the enumerated advantages. Additionally, other technical advantages may become readily apparent to one of ordinary skill in the art after review of the following figures and description.

BRIEF DESCRIPTION OF THE DRAWINGS

A more complete understanding of embodiments of the disclosure will be apparent from the detailed description taken in conjunction with the accompanying drawings in which.

DETAILED DESCRIPTION OF EXAMPLE EMBODIMENTS

It should be understood at the outset that, although example implementations of embodiments are illustrated below, the present invention may be implemented using any number of techniques, whether currently known or not. The present invention should in no way be limited to the example implementations, drawings, and techniques illustrated below. Additionally, the drawings are not necessarily drawn to scale.

As previously described, a radome may be used to protect an antenna from the environment. The power transmitted by the antenna, however, may have the effect of heating the radome. Exposure to heat may compromise the electrical performance of the radome, may increase the infrared signature of the radome, and/or may cause the layers of the radome to separate, blister, or delaminate. Exposure to substantial amounts of heat may be a particular problem for radomes that are configured with large, high-powered antennas, such as certain active electronically scanned array (AESA) antennas. Known heat removal systems, such as passive and modified-passive systems, may not be able to remove a sufficient amount of heat to prevent the radome from becoming damaged.

Figure 1:
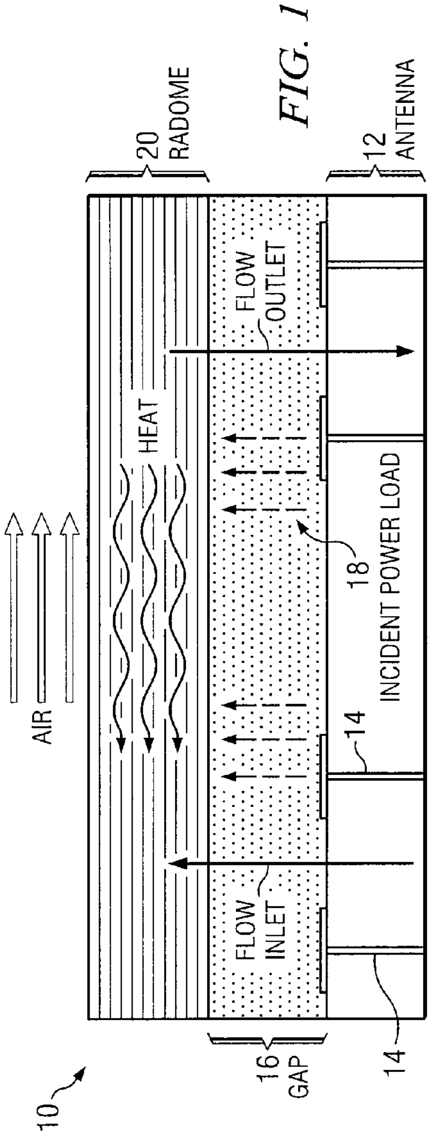
FIG. 1 illustrates an example of an antenna system comprising a radome configured with an internal cooling system.

FIG. 1 illustrates an example of an antenna system 10 comprising a radome configured with an internal cooling system. In some embodiments, antenna system 10 may include an antenna 12, a gap 16, and a radome 20. Any suitable antenna 12 may be used, such as, but not limited to, an array antenna or an AESA antenna. The antenna 12 may comprise antenna elements 14 for transmitting and/or receiving electromagnetic waves. The gap 16 may separate the antenna 12 and the radome 20. The gap 16 may comprise any suitable material, such as air or foam. In some embodiments, foam may provide structural support to the radome 20 and may minimize bending or deforming failures.

In some embodiments, the electromagnetic waves transmitted by the antenna 12 may generate an incident power load on the radome 20. As the electromagnetic waves pass through the radome, some power loss may occur which may result in the generation of heat (also sometimes referred to as thermal energy). The heat may originate at a surface of the radome 20 proximate to the antenna 12 and may be conducted outward toward the other layers. Thus, the innermost layers of the radome 20 may be exposed to particularly high heat. The amount of heat generated may be affected by properties of the radome 20, such as the number of layers, the thickness of each layer, and the constituent materials. In some embodiments, one or more heat removal systems may be used to dissipate heat from the radome 20. For example, passive and modified passive systems may dissipate heat by circulating air on an outer surface of the radome 20. As another example, an internal cooling system may be used to dissipate heat from within the radome 20. In some embodiments, the internal cooling system may introduce a fluid through one or more flow inlets, conduct heat from the radome 20 to the fluid, and exhaust the heated fluid through one or more flow outlets. Further details of embodiments of such an internal cooling system are shown and described below.

Figure 2:
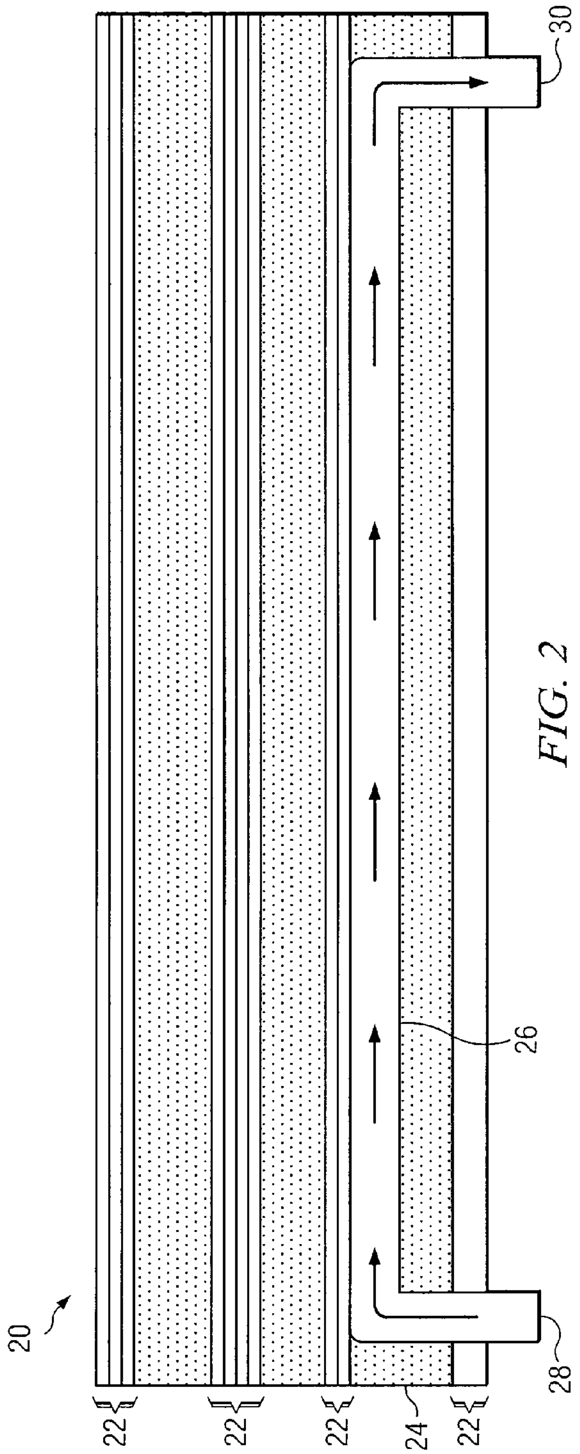
FIG. 2 illustrates an example of a cross-sectional view of a radome configured with an internal cooling system and operable to cover an opening of an antenna.

FIG. 2 illustrates an example of a cross-sectional view of a radome 20 configured with an internal cooling system and operable to cover an opening of an antenna. The radome 20 may comprise a plurality of layers. The layers may overlie one another and may be operable to cover an opening of an antenna, such as the antenna 12 of FIG. 1. In some embodiments, the plurality of layers may include dielectric layers 22 which may be alternately layered with internal layers 24. One or more internal layers 24 may be configured with an internal cooling system. For example, an internal layer 24 may be configured with a fluid channel 26 configured to receive a fluid through an inlet port 28, conduct heat from the radome 20 to the fluid, and exhaust the heated fluid through an outlet port 30.

In some embodiments, the layers of the radome 20 may be formed of any material commonly used in the construction of radomes. As non-limiting examples, the dielectric layers 22 may include fiberglass, polytetrafluoroethylene (PFTE) coated fabric, or the like, and the internal layers 24 may include foam or composite honeycomb. In some embodiments, the internal layers 24 may have a dielectric constant that is substantially matched to the dielectric constant of the fluid used to cool the radome 20. As an example, the dielectric constants may substantially match if they are within approximately +/−20% of one another. Matching the dielectric constants may allow electromagnetic waves to pass through the radome 20 relatively unchanged so that the performance characteristics of the antenna may be maintained. In some embodiments, the dielectric constants of the internal layer 24 and the fluid may be relatively low. Examples may include dielectric constants ranging from 1.2 to 12.

In some embodiments, the fluid may be any suitable liquid or gaseous material. Any fluid having an impedance selected to substantially match the impedance of the internal layer may be used. As non-limiting examples, the fluid may include water or an electrically insulating, stable fluorocarbon-based coolant, such as FLUORINERT by 3M Company, located in Maplewood, Minn. The fluid and the materials of the radome 20 may be selected in any suitable manner. In some embodiments, a fluid may be selected first, for example, based on certain cooling properties, and the materials for the internal layer 24 of the radome may then be selected to substantially match the impedance of the fluid. Alternatively, the materials for the internal layer 24 may be selected first, for example, based on certain structural or electrical properties, and the fluid may then be selected to substantially match the impedance of the internal layer 24.

The fluid circulated through the fluid channel 26 of the internal cooling system may enter the inlet port 28 at a lower temperature than that of the radome 20. As the fluid moves through the fluid channel 26, heat from the radome may be transferred to the fluid. In some embodiments, the heated fluid may exit the outlet port 30 and may be directed to an external cooling system to be cooled. The cooled fluid may be re-circulated through the fluid channel 26 of the radome 20 for continual cooling of the radome 20.

Modifications, additions, or omissions may be made to the previously described system without departing from the scope of the disclosure. The system may include more, fewer, or other components. For example, any suitable combination of materials and/or number of dielectric layers 22, internal layers 24, fluid channels 26, inlet ports 28, and outlet ports 30 may be used. In some embodiments, a minimum number of fluid channels required to adequately cool the radome 20 may be used so that the effect of the internal cooling system on the performance of the antenna is minimized. In some embodiments, the internal cooling system may be configured only in the internal layer 24 closest to the antenna, that is, the internal layer 24 closest to the origin of the heat.

Figure 3C:
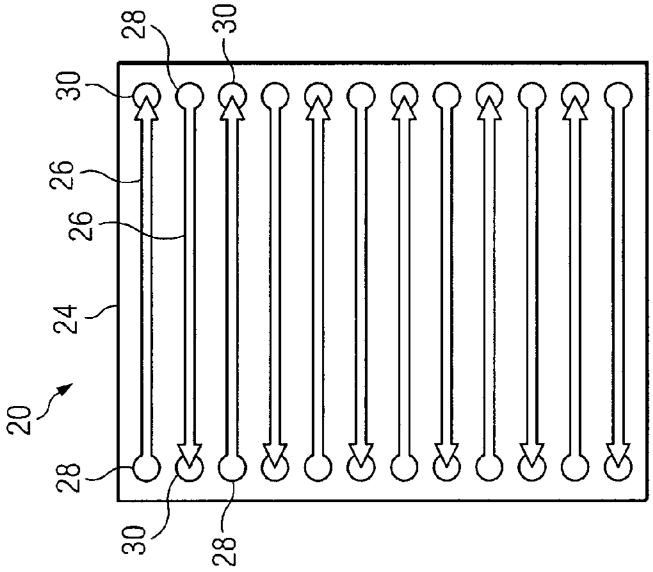
FIGS. 3A-3C illustrate examples of flow options for a fluid channel of an internal cooling system, viewed from the top.
Figure 3B:
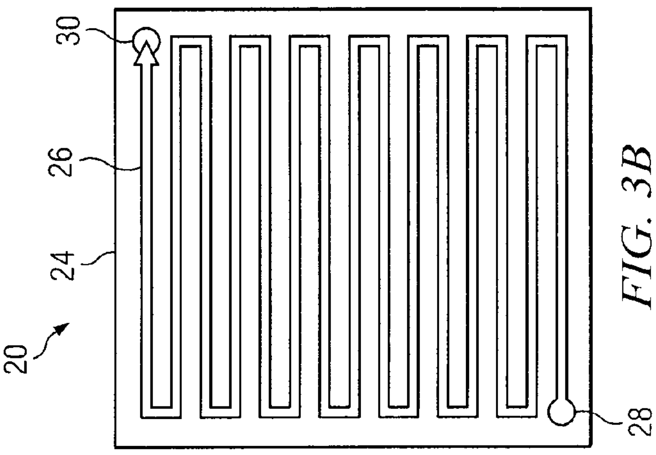
Figure 3A:
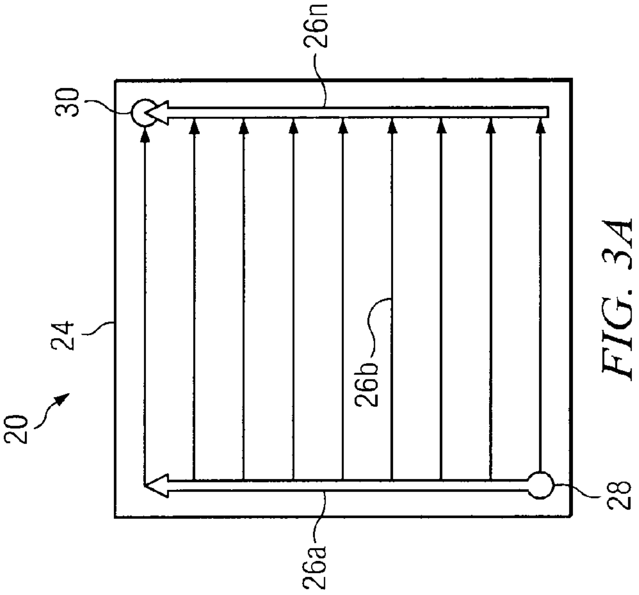

FIGS. 3A-3C illustrate examples of flow options for a fluid channel of an internal cooling system, viewed from the top, however any suitable flow option may be used. FIG. 3A illustrates an example where a fluid enters the internal cooling system through an inlet port 28 and is directed to a first fluid channel **26*a*. The first fluid channel 26*a* directs some of the fluid to each of a number of additional fluid channels, such as the fluid channel 26*b*. The number of additional fluid channels flow toward a last fluid channel 26*n*, and the last fluid channel 26*n* recombines the fluid from the separate streams and directs the fluid to an outlet port 30**.

FIG. 3B illustrates an example where a fluid enters the internal cooling system through an inlet port 28 and is directed to a single fluid channel 26. The fluid channel 26 is configured in a serpentine-like shape that winds across the length and width of the radome 20. The fluid exits the radome through an outlet port 30.

FIG. 3C illustrates an example where a fluid enters the internal cooling system through a number of inlet ports 28, flows across the radome 20 via a number of fluid channels 26, and exits the radome 20 through a number of outlet ports 30. In some embodiments, the internal cooling system may be configured with some fluid channels flowing in different directions than other fluid channels. Accordingly, different portions of the radome 20 may receive the fluid at its coolest temperature to allow for even cooling throughout the radome 20.

Figure 4A:
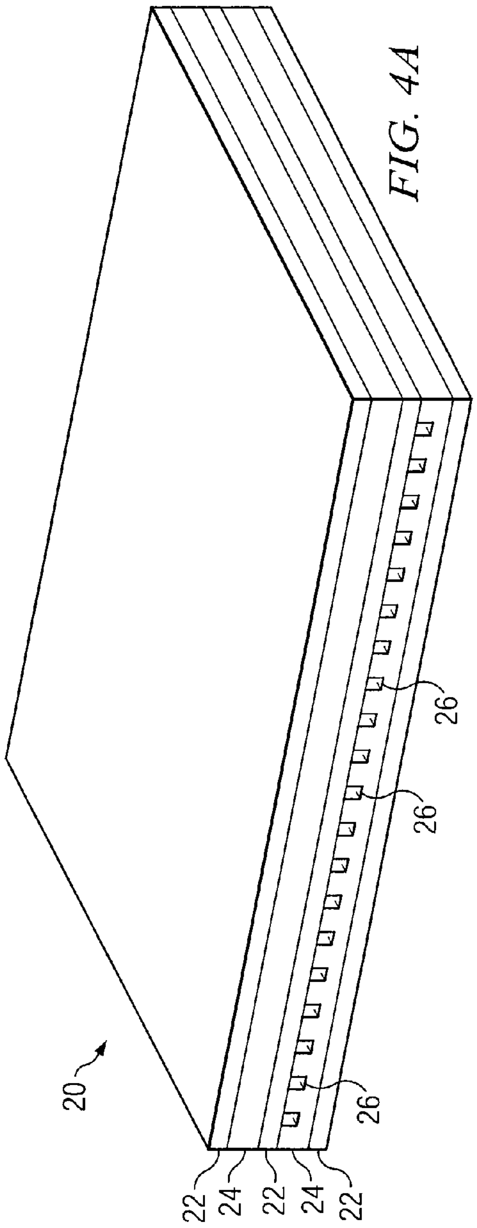
FIGS. 4A-4D illustrate examples of configurations for a fluid channel of an internal cooling system, viewed from the side.

FIGS. 4A-4D illustrate examples of configurations for a fluid channel of an internal cooling system, viewed from the side. FIG. 4A illustrates an example of a single-sided, half-channel configuration. In the embodiment, the fluid channels 26 are configured on only one side of a dielectric layer 22, and the fluid channels 26 extend only partially through the thickness of the internal layer 24.

Figure 4B:
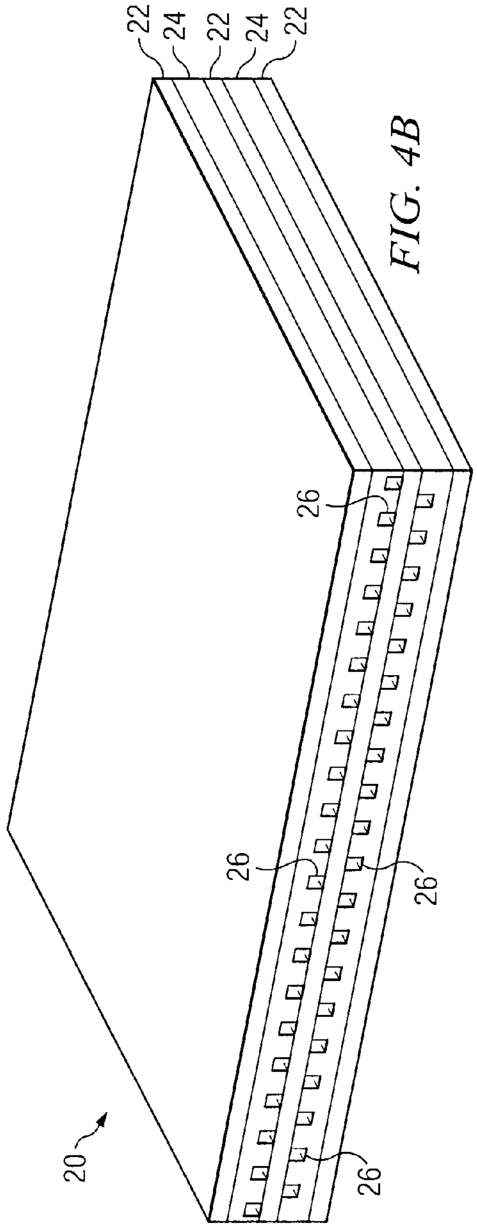

FIG. 4B illustrates an example of a double-sided, half-channel configuration. In the embodiment, the fluid channels 26 are configured on both sides of a dielectric layer 22 such that two internal layers 24 include the fluid channels 26. The spacing between the fluid channels 26 may be offset along the length of the radome 20, where a fluid channel 26 of a first internal layer 24 may be located between two neighboring fluid channels 26 of a second internal layer 24. The fluid channels 26 may extend partially through the thickness of the internal layers 24 as shown, or fully through the thickness of the internal layers 24 (not shown).

Figure 4C:
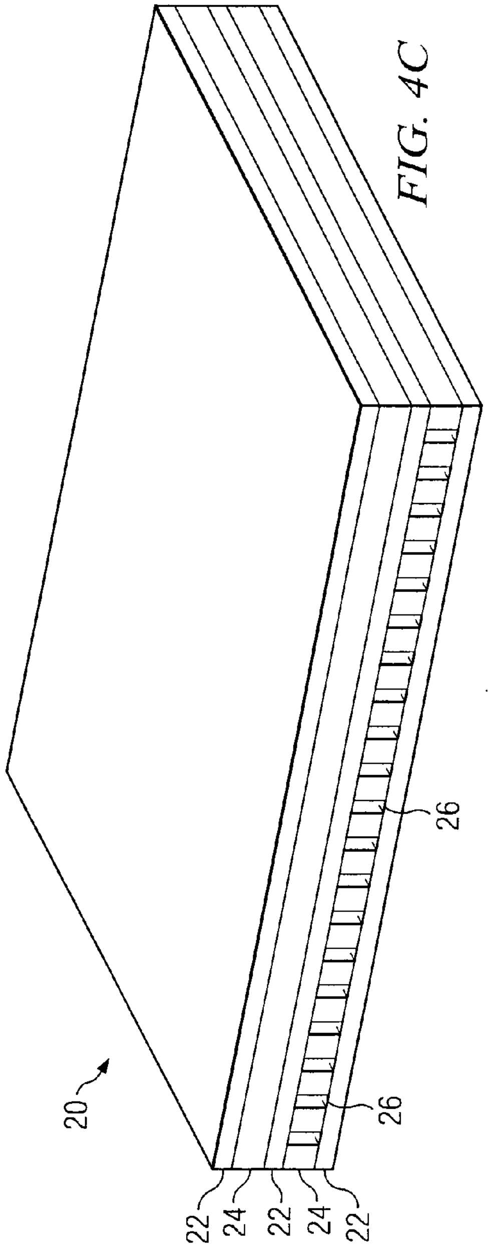

FIG. 4C illustrates an example of a single-sided, full-channel configuration. In the embodiment, the fluid channels 26 are configured on only one side of a dielectric layer 22, and the fluid channels 26 extend fully through the thickness of the internal layer 24.

Figure 4D:
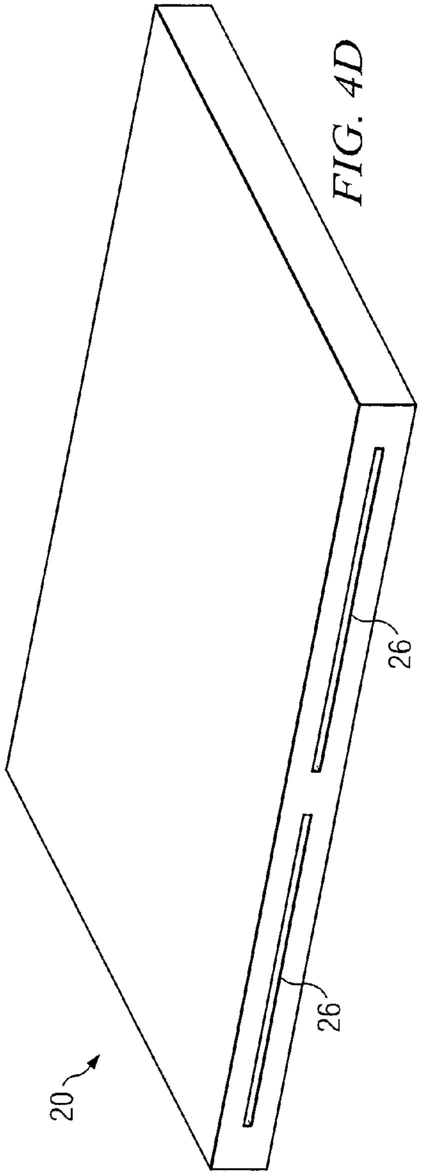

FIG. 4D illustrates an example where two fluid channels 26 are positioned adjacent to one another to substantially extend across the length of the radome 20. Any number of fluid channels 26, however, may be used. The fluid channels 26 may extend across the width of the radome 20 in any suitable fashion. For example, the fluid channels 26 may be shaped as wide, substantially flat plates, or a number of narrow fluid channels 26 may be configured adjacent to one another.

Although certain embodiments have been illustrated, any suitable configuration may be used. For example, a cross-section of the fluid channels 26 may have any suitable shape, including rounded shapes, such as circles and ovals, or polygonal shapes, such as rectangles and triangles. Additionally, the fluid channels 26 may be configured in any layer, and the number of fluid channels 26 and the flow pattern of the fluid channels 26 may vary, as described above. In some embodiments, the configuration may be selected according to engineering performance determinations or according to ease of manufacture.

Figure 5:
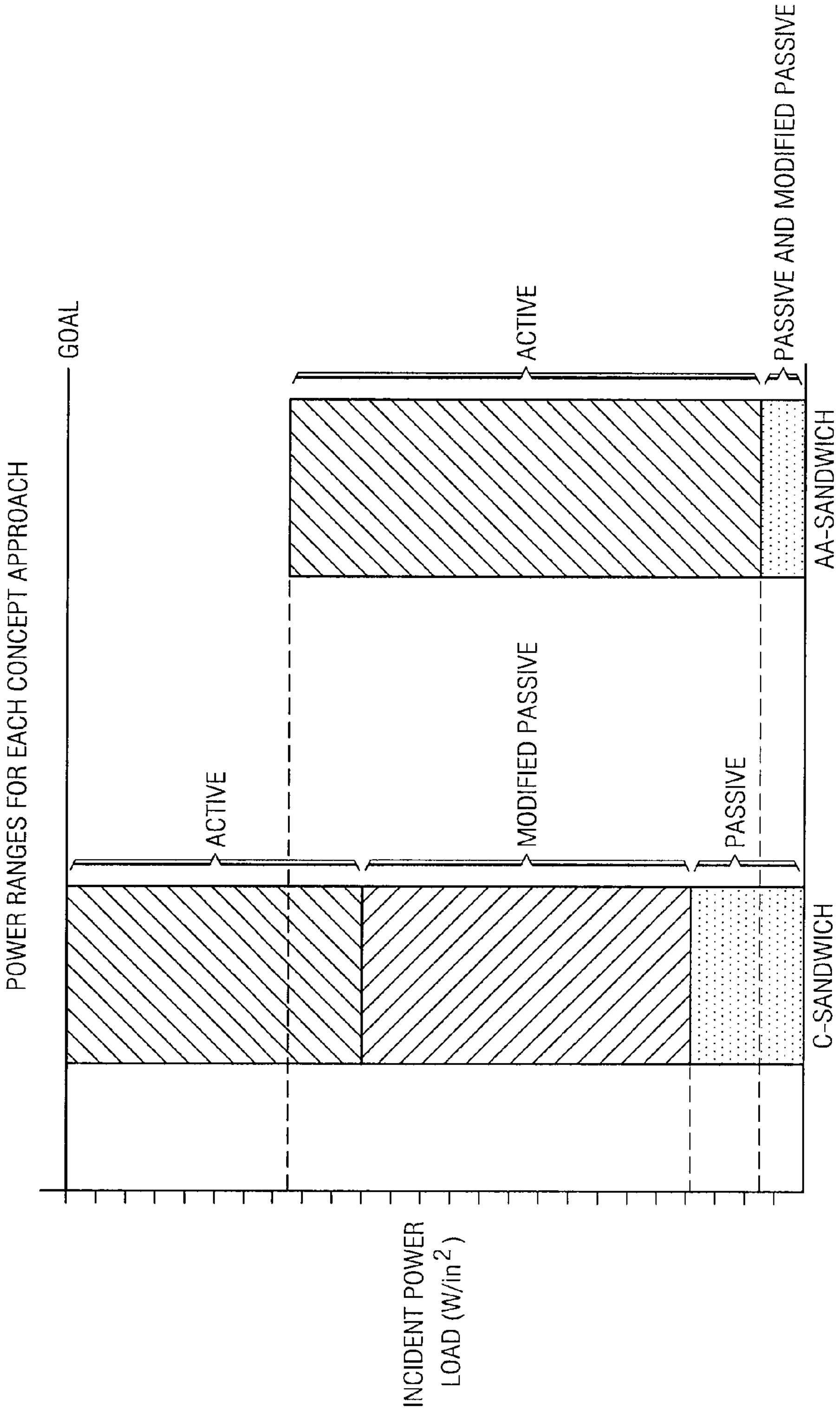
FIG. 5 is a graph showing estimated incident power load dissipation levels that may be achieved using various types of heat removal systems for radomes.

FIG. 5 is a graph showing estimated incident power load dissipation levels that may be achieved using various types and combinations of heat removal systems for radomes. The heat removal systems may include passive systems, such as natural air flow (wind) across the outer surface of the radome, modified-passive systems, such as forced air flow across the outer surface of the radome, and active systems, such as the internal cooling system described in FIGS. 1-4. The results are simulated for radomes having a C-Sandwich construction and an AA-Sandwich construction. In some embodiments, a C-Sandwich construction may comprise 3 laminate dielectric layers alternately layered with 2 low density foam internal layers. In some embodiments, an AA-Sandwich construction may comprise 4 laminate dielectric layers alternately layered with 3 low density foam internal layers.

The chart illustrates that the active, internal cooling system may increase incident power load dissipation by approximately 20 Watts/inch$^2$ for C-Sandwich configurations and approximately 30 Watts/inch$^2$ for AA-Sandwich configurations. In addition to increasing the amount of incident power load dissipated, the internal cooling system may dissipate heat from the inner layers of the radome. The inner layers may be exposed to higher levels of heat due to their proximity to the antenna, and may therefore be more prone to heat damage unless the heat is removed. Passive and modified-passive systems, however, may be unable to adequately cool the inner layers.

While the present invention has been described in detail with reference to particular embodiments, numerous changes, substitutions, variations, alterations and modifications may be ascertained by those skilled in the art, and it is intended that the present invention encompass all such changes, substitutions, variations, alterations and modifications as falling within the spirit and scope of the appended claims.

What is claimed is:

1. A radome, comprising:

two dielectric layers comprising a dielectric material, the dielectric layers overlying one another and including portions thereof that cover an opening of an antenna; and an internal layer between the two dielectric layers, the internal layer including an internal cooling system, the internal cooling system comprising:

a fluid channel configured to:

receive a fluid through an inlet port, which extends through one of the two dielectric layers closer to the antenna and through an antenna side of the internal layer and which is oriented substantially perpendicularly with respect to an entirety of the portions of the two dielectric layers, the fluid comprising a water or an electrically insulating fluorocarbon-based fluid; conduct heat from the radome to the fluid;

carry the fluid from the inlet port to an outlet port along a channel section extending along a side of the internal layer opposite the antenna side; and exhaust the heated fluid through the outlet port, which extends through the antenna side of the internal layer and through the one of the two dielectric layers closer to the antenna and which is oriented substantially perpendicularly with respect to the entirety of the portions of the two dielectric layers;

wherein an impedance of the fluid and an impedance of the internal layer each relate to respective characteristic abilities of the fluid and the internal layer to permit transmission of electro-magnetic radiation and substantially match.

2. The radome of claim 1, wherein the internal layer comprises a first dielectric constant and the fluid comprises a second dielectric constant, wherein: the first dielectric constant ranges from 1.2 to 12; and the first dielectric constant and the second dielectric constant substantially match.

3. The radome of claim 1, wherein: the internal layer comprises a first dielectric constant; the fluid comprises a second dielectric constant; and the first dielectric constant is within 20% of the second dielectric constant.

4. A radome, comprising:

two dielectric layers comprising a dielectric material, the dielectric layers overlying one another and including portions thereof that cover an opening of an antenna; and an internal layer between the two dielectric layers, the internal layer including an internal cooling system, the internal cooling system comprising:

a fluid channel comprising:

an inlet port, which extends through one of the two dielectric layers closer to the antenna and through an antenna side of the internal layer and which is oriented substantially perpendicularly with respect to an entirety of the portions of the two dielectric layers;

an outlet port, which extends through the antenna side of the internal layer and through the one of the two dielectric layers closer to the antenna and which is oriented substantially perpendicularly with respect to the entirety of the portions of the two dielectric layers; and a channel section, which extends along a side of the internal layer opposite the antenna side and which carries the fluid from the inlet port to the outlet port;

wherein an impedance of the fluid and an impedance of the internal layer each relate to respective characteristic abilities of the fluid and the internal layer to permit transmission of electro-magnetic radiation and substantially match.

5. The radome of claim 4, the internal cooling system further comprising: a fluid channel configured to: receive a fluid through the inlet port; conduct heat from the radome to the fluid; and exhaust the heated fluid through the outlet port.

6. The radome of claim 4, the internal cooling system further comprising: a fluid channel configured to: receive a fluid through the inlet port, the fluid comprising a coolant having a gaseous or liquid form; conduct heat from the radome to the fluid; and exhaust the heated fluid through the outlet port.

7. The radome of claim 4, the internal cooling system further comprising: a fluid channel configured to: receive a fluid through the inlet port, the fluid comprising a water or an electrically insulating fluorocarbon-based fluid; conduct heat from the radome to the fluid; and exhaust the heated fluid through the outlet port.

8. The radome of claim 4, the internal cooling system further comprising: a fluid channel configured to: receive a fluid through the inlet port; conduct heat from the radome to the fluid; and exhaust the heated fluid through the outlet port.

9. The radome of claim 4, the internal cooling system further comprising: a plurality of fluid channels configured to conduct heat from the radome to a fluid, the plurality of fluid channels including: a first fluid channel configured to receive the fluid from the inlet port; a second fluid channel configured to exhaust the heated fluid through the outlet port; and a third fluid channel configured to direct the fluid from the first fluid channel to the second fluid channel.

10. The radome of claim 4, wherein the inlet port comprises first and second inlet ports and the outlet port comprises first and second outlet ports, the internal cooling system further comprising: a plurality of fluid channels configured to conduct heat from the radome to a fluid, the plurality of fluid channels including: a first fluid channel configured to receive the fluid from the first inlet port and to exhaust the fluid through the first outlet port; and a second fluid channel configured to receive the fluid from the second inlet port and to exhaust the fluid through the second outlet port.

11. A radome, comprising:

two dielectric layers comprising a dielectric material, the dielectric layers overlying one another and including portions thereof that cover an opening of an antenna; and an internal layer between the two dielectric layers, the internal layer including a fluid channel configured to:

receive a fluid through an inlet port, which extends through one of the two dielectric layers closer to the antenna and through an antenna side of the internal layer and which is oriented substantially perpendicularly with respect to an entirety of the portions of the two dielectric layers;

conduct heat from the radome to the fluid;

carry the fluid from the inlet port to an outlet port along a channel section extending along a side of the internal layer opposite the antenna side; and exhaust the heated fluid through the outlet port, which extends through the antenna side of the internal layer and through the one of the two dielectric layers closer to the antenna and which is oriented substantially perpendicularly with respect to the entirety of the portions of the two dielectric layers;

wherein an impedance of the fluid and an impedance of the internal layer each relate to respective characteristic abilities of the fluid and the internal layer to permit transmission of electro-magnetic radiation and substantially match.

12. The radome of claim 11, wherein the fluid channel has a cross-sectional area that extends partially through the internal layer.

13. The radome of claim 11, wherein the fluid channel has a cross-sectional area that extends fully through the internal layer.

14. The radome of claim 11, wherein a dielectric constant of the internal layer and a dielectric constant of the fluid substantially match.

15. The radome of claim 11, wherein the internal layer comprises a first dielectric constant and the fluid comprises a second dielectric constant, wherein: the first dielectric constant ranges from 1.2 to 12; and the first dielectric constant and the second dielectric constant substantially match.

16. The radome of claim 11, wherein the fluid channel extends through the internal layer in a serpentine fashion.

17. A radome, comprising:

a plurality of layers overlying one another and including portions thereof that cover an opening of an antenna; and an internal cooling system comprising a fluid channel configured to:

receive a fluid through an inlet port, which extends through one of the plurality of layers closer to the antenna and through an antenna side of internal layer interposed between the one of the plurality of layers closer to the antenna and a next one of the plurality of layers and which is oriented substantially perpendicularly with respect to an entirety of the portions of the plurality of layers;

conduct heat from the radome to the fluid;

carry the fluid from the inlet port to an outlet port along a channel section extending along a side of the internal layer opposite the antenna side; and exhaust the heated fluid through the outlet port, which extends through the antenna side of the internal layer and through the one of the plurality of layers closer to the antenna and which is oriented substantially perpendicularly with respect to the entirety of the portions of the plurality of layers;

wherein an impedance of the fluid and an impedance of at least one of the layers of the plurality of layers each relate to respective characteristic abilities of the fluid and the at least one of the layers to permit transmission of electromagnetic radiation and substantially match.

18. The radome of claim 17, further comprising: a first layer of the plurality of layers comprising a dielectric material; a second layer of the plurality of layers comprising a foam or a honeycomb material, the second layer including the fluid channel.

19. The radome of claim 17, further comprising: the plurality of layers comprising a number of dielectric layers and a number of internal layers, the internal layers alternately layered between the dielectric layers, at least one internal layer of the number of internal layers comprising the fluid channel.

20. The radome of claim 17, further comprising: the plurality of layers comprising a number of dielectric layers and a number of internal layers, the internal layers alternately layered between the dielectric layers, wherein: at least one internal layer of the number of internal layers comprises the fluid channel; and the at least one internal layer includes the internal layer closest to the antenna.

21. The radome of claim 17, wherein: the fluid comprises a relatively low dielectric constant.

* * * * *